United States Patent
Fukuzumi et al.

(10) Patent No.: US 7,615,813 B2
(45) Date of Patent: Nov. 10, 2009

(54) SEMICONDUCTOR DEVICE USING FUSE/ANTI-FUSE SYSTEM

(75) Inventors: Yoshiaki Fukuzumi, Yokohama (JP); Yusuke Kohyama, Yokosuka (JP)

(73) Assignee: Kabushiki Kaisha Toshiba, Kawasaki-shi (JP)

(*) Notice: Subject to any disclaimer, the term of this patent is extended or adjusted under 35 U.S.C. 154(b) by 110 days.

(21) Appl. No.: 11/859,388

(22) Filed: Sep. 21, 2007

(65) Prior Publication Data

US 2008/0012057 A1    Jan. 17, 2008

Related U.S. Application Data

(62) Division of application No. 10/872,506, filed on Jun. 22, 2004, now abandoned, which is a division of application No. 09/783,023, filed on Feb. 15, 2001, now Pat. No. 6,774,439.

(30) Foreign Application Priority Data

Feb. 17, 2000 (JP) ............................. 2000-039968

(51) Int. Cl.
*H01L 21/8234* (2006.01)

(52) U.S. Cl. ............... 257/288; 257/330; 257/E29.131; 257/E29.262; 257/E21.141

(58) Field of Classification Search ............... 438/131, 438/156, 206, 209, 212, 271; 257/288, 330, 257/E29.131, E29.262, E21.141
See application file for complete search history.

(56) References Cited

U.S. PATENT DOCUMENTS

| | | | |
|---|---|---|---|
| 4,116,720 A | 9/1978 | Vinson | |
| 4,194,283 A * | 3/1980 | Hoffmann | ............... 438/239 |
| 4,547,791 A | 10/1985 | Roger et al. | |
| 5,065,273 A | 11/1991 | Rajeevakumar | |
| 5,208,177 A | 5/1993 | Lee | |
| 5,282,158 A | 1/1994 | Lee | |
| 5,331,196 A | 7/1994 | Lowrey et al. | |

(Continued)

FOREIGN PATENT DOCUMENTS

JP   63-237542 A   10/1988

(Continued)

OTHER PUBLICATIONS

Wolf, Stanley, "Silicon Processing for the VLSI Era: vol. 2 Process Integration," Lattice Press, pp. 332-336.

(Continued)

*Primary Examiner*—George Fourson
(74) *Attorney, Agent, or Firm*—Banner & Witcoff, Ltd.

(57) ABSTRACT

A first concave portion for the element isolation, a second concave portion for an aligning mark, and a third concave portion for an anti-fuse portion are formed simultaneously within a silicon substrate. After a silicon oxide film is formed on the entire surface, the silicon oxide film positioned within the second and third concave portions is removed. Then, a gate insulating film is formed on the entire surface, followed by forming a polysilicon film on the gate insulating film. Further, these polysilicon film and gate insulating film are selectively removed to form a gate electrode above an element region, an aligning mark portion in the second concave portion, and a gate electrode for an anti-fuse portion on the bottom surface of the third concave portion.

16 Claims, 14 Drawing Sheets

U.S. PATENT DOCUMENTS

| | | | |
|---|---|---|---|
| 5,498,895 A | 3/1996 | Chen | |
| 5,629,227 A | 5/1997 | Chen | |
| 5,811,336 A * | 9/1998 | Kasai | 438/271 |
| 5,811,858 A | 9/1998 | Ohkubo | |
| 5,866,937 A | 2/1999 | McCollum | |
| 5,903,042 A | 5/1999 | Kwok et al. | |
| 5,913,138 A | 6/1999 | Yamaoka et al. | |
| 5,920,778 A * | 7/1999 | Rosner et al. | 438/270 |
| 5,926,698 A | 7/1999 | Ohkubo | |
| 5,981,995 A * | 11/1999 | Selcuk | 257/330 |
| 6,043,543 A | 3/2000 | Klose | |
| 6,087,214 A * | 7/2000 | Cunningham | 438/244 |
| 6,130,469 A | 10/2000 | Bracchitta et al. | |
| 6,133,586 A | 10/2000 | Ohkubo | |
| 6,215,197 B1 | 4/2001 | Iwamatsu | |
| 6,335,228 B1 | 1/2002 | Fuller et al. | |
| 6,376,348 B1 | 4/2002 | Schrems | |
| 6,388,305 B1 | 5/2002 | Bertin et al. | |
| 6,787,878 B1 * | 9/2004 | Nagai et al. | 257/529 |
| 6,815,751 B2 * | 11/2004 | Brown et al. | 257/305 |
| 6,974,987 B2 * | 12/2005 | Ogawa et al. | 257/296 |
| 6,995,415 B2 * | 2/2006 | Ogawa et al. | 257/296 |
| 7,019,348 B2 * | 3/2006 | Tu | 257/301 |
| 7,247,901 B2 * | 7/2007 | Chou | 257/296 |
| 7,326,619 B2 * | 2/2008 | Park et al. | 438/282 |
| 2001/0003034 A1 | 6/2001 | Furukawa et al. | |
| 2001/0031535 A1 | 10/2001 | Agnello et al. | |
| 2001/0055839 A1 | 12/2001 | Lehr et al. | |
| 2002/0030234 A1 | 3/2002 | Ohuchi et al. | |
| 2002/0105051 A1 | 8/2002 | Bertin et al. | |
| 2005/0189609 A1 * | 9/2005 | Tu | 257/510 |
| 2006/0017115 A1 * | 1/2006 | Tu et al. | 257/371 |

FOREIGN PATENT DOCUMENTS

| | | |
|---|---|---|
| JP | 4-234158 A | 8/1992 |
| JP | 5-021724 A | 1/1993 |
| JP | 8-241929 A | 9/1996 |
| JP | 9-8154 A | 1/1997 |
| JP | 9-266258 A | 10/1997 |
| JP | 11-67894 A | 3/1999 |
| JP | 11-97559 A | 4/1999 |
| JP | 11-163285 A | 6/1999 |
| JP | 11-163346 A | 6/1999 |
| JP | 11-204759 A | 7/1999 |
| JP | 11-284137 A | 10/1999 |
| JP | 11-330381 A | 11/1999 |
| JP | 11-345888 A | 12/1999 |
| JP | 2000-36545 A | 2/2000 |
| JP | 2000-503167 A | 3/2000 |
| WO | 97/20337 A2 | 6/1997 |

OTHER PUBLICATIONS

JP Office Action dtd Oct. 7, 2008, JP Appln. 2001-040620.
JP Office Action dtd Feb. 3, 2009, JP Appln. 2001-040620.

* cited by examiner

DURING FUSE BREAKDOWN:
POSITIVE VOLTAGE (+) IS APPLIED TO GATE
DURING ACTUAL USE (JUDGEMENT):
NEGATIVE VOLTAGE (-) IS APPLIED TO GATE

DURING FUSE BREAKDOWN:
NEGATIVE VOLTAGE (-) IS APPLIED TO GATE
DURING ACTUAL USE (JUDGEMENT):
POSITIVE VOLTAGE (+) IS APPLIED TO GATE

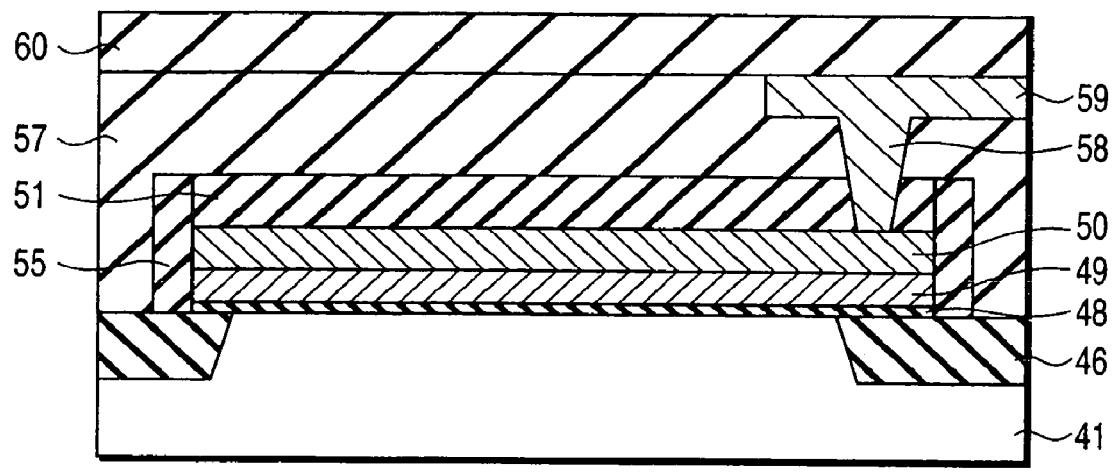
F I G. 26
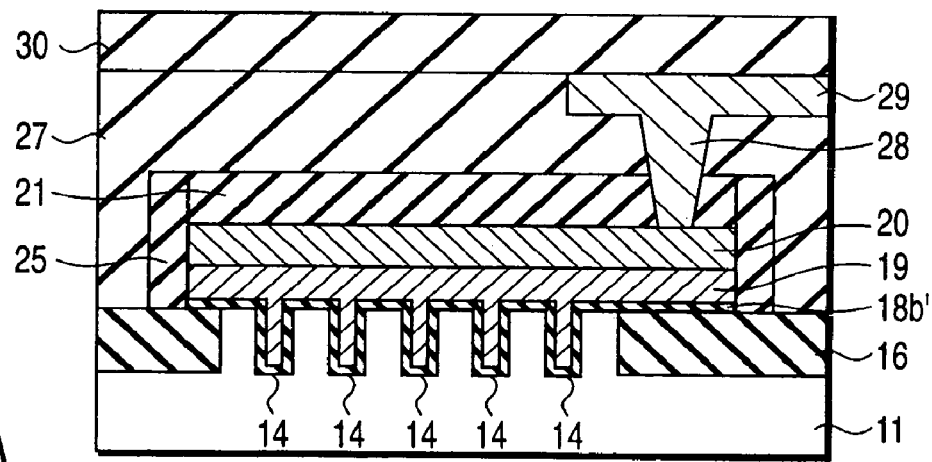
F I G. 27A
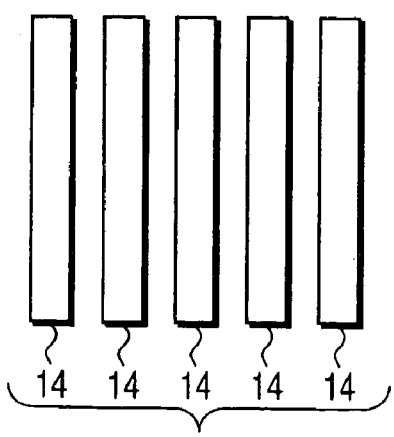
F I G. 27B

SEMICONDUCTOR DEVICE USING FUSE/ANTI-FUSE SYSTEM

CROSS-REFERENCE TO RELATED APPLICATIONS

This application is a divisional of Ser. No. 10/872,506, filed Jun. 22, 2004, now abandoned which is a divisional application of prior U.S. Ser. No. 09/783,023, now U.S. Pat. No. 6,774,439 filed Feb. 15, 2001, which is based upon and claims the benefit of priority from the prior Japanese Patent Application No. 2000-039968, filed Feb. 17, 2000.

BACKGROUND OF THE INVENTION

The present invention relates to a semiconductor device using a fuse/anti-fuse system and a method of manufacturing the same.

In recent years, the semiconductor device is being made finer and finer to a high degree. In this connection, the element isolating region for isolating the element is formed mainly by a STI (Shallow Trench Isolation) method in place of the conventional LOCOS (Local Oxidation Of Silicon) method. It should be noted, however, that the film formed by the STI method has a very high surface flatness, with the result that, in the subsequent step of forming the gate electrode, it was necessary to employ the stepping process for forming an aligning mark.

FIGS. 28 to 33 are cross sectional views collectively showing the conventional process of manufacturing a semiconductor device. The conventional process of forming a semiconductor device will now be described with reference to FIGS. 28 to 33.

In the first step, a first concave portion 42 providing an element isolation region and a second concave portion 43, which is used in the subsequent lithography process for forming an aligning mark, are formed in a silicon substrate 41 by a lithography technology and an RIE (Reactive Ion Etching) method, as shown in FIG. 28.

In the next step, for example, a silicon oxide film 45 is formed on the entire surface so as to fill the first and second concave portions 42 and 43 with the silicon oxide film 45, as shown in FIG. 29. Then, the silicon oxide film 45 is removed by a CMP (Chemical Mechanical Polish) method until the surface of the silicon substrate 41 is exposed to the outside, thereby forming an element isolating region 46 of an STI structure in the first concave portion 42.

After formation of the element isolating region 46, a resist film 47 is formed on the entire surface, followed by patterning the resist film 47 by the lithography technology and the RIE method, as shown in FIG. 30. Then, the silicon oxide film 45 within the second concave portion 43 is removed by the wet etching performed with the patterned resist film 47 used as a mask, thereby an aligning mark portion 53 is formed in the second concave portion 43. Followed by removing the resist film 47. In the following description, the step of removing the silicon oxide film 45 buried in the second concave portion 43 is called the stepping process.

In the next step, a gate insulating film 48 is formed on the entire surface, as shown in FIG. 31, followed by forming a polycrystalline silicon (polysilicon) film 49 on the gate insulating film 48. Further a tungsten film 50 is formed on the polysilicon film 49, and a silicon nitride film 51 is formed on the tungsten film 50.

Then, the silicon nitride film 51, the tungsten film 50, the polysilicon film 49 and the gate insulating film 48 are selectively removed by the lithography technology and the RIE method, as shown in FIG. 32. As a result, a gate electrode 52 is formed on a predetermined element region 46a. Incidentally, the gate insulating film of the gate electrode 52 is denoted by a reference numeral 48a.

In the next step, a gate side wall 55 is formed on the side surface of the gate electrode 52, and source-drain regions 56 are formed in surface regions of the silicon substrate 41 in contact with the edge portions of the gate insulating film 48a by the known technology, as shown in FIG. 33. Then, an interlayer insulating film 57 is formed on the entire surface, followed by forming a contact plug 58 and an upper wiring layer 59 and subsequently forming another interlayer insulating film 60 on the entire surface.

Where the tungsten film 50, etc. is used as a part of the gate electrode 52 as described above, it is difficult to read the difference in the film quality of the underlying layer by an optical method because the tungsten film 50 has a high reflectance. Therefore, if the stepping process for forming the aligning mark portion 53, which is shown in FIG. 30, is omitted, it is impossible to read the aligning mark portion 53 by an optical method in the case of employing because the aligning mark portion 53 is no step, for example, the STI method that permits the formed film to have a high degree of surface flatness. It follows that the problem of the deviation in the alignment between the element isolating region 46 (or element region 46a) and the gate electrode 52 is rendered serious.

As described above, the lithography step and the etching step included in the stepping process are indispensable for avoiding the problem of the deviation in the alignment. However, since these steps are used solely for the stepping of the aligning mark portion 53, it was desirable to omit these steps or to effectively utilize these steps.

On the other hand, in, for example, a DRAM (Dynamic Random Access Memory), the apparatus is equipped in many cases with a remedy circuit for substituting an auxiliary cell for the defective cell in order to improve the yield of the product. For the judgment of the cell that is to be renewed, it was customary to use a fuse of the type that the wiring made of mainly aluminum is fused away by a laser beam. On the other hand, proposed is an anti-fuse in which the judgment is performed by breaking the gate insulating film in a predetermined portion.

The anti-fuse is expected to produce various merits. For example, the anti-fuse is expected to decrease the area occupied within the chip and to permit replacing the final defective cell after sealing the package. Also, in the anti-fuse, a desired gate insulating film is broken to make the device conductive by applying a voltage higher than the breakdown voltage. Therefore, in general, the anti-fuse is connected to a high voltage generating circuit for breaking the gate insulating film and to a judging circuit for detecting whether the anti-fuse portion is broken or not. It follows that, in breaking the anti-fuse portion, the gate insulating film in the judging circuit portion also is damaged to some extent. Such being the situation, it was desirable to permit the anti-fuse portion to be broken with a reasonably low voltage while suppressing the damage done to the judging circuit and other portions as much as possible.

Also, in order to suppress the increase in the number of manufacturing steps, it is desirable to form the gate insulating film in the anti-fuse portion simultaneously with formation of the gate insulating film of the MOS transistor. However, it was difficult to form the gate insulating film of the anti-fuse portion having a low breakdown voltage simultaneously with formation of the gate insulating film included in the ordinary transistor and having a high reliability. Under the circumstances, it was difficult to put to the practical use the anti-fuse utilizing the gate insulating film formed for the transistor.

BRIEF SUMMARY OF THE INVENTION

An object of the present invention, which has been achieved in an attempt to solve the above-noted problems, is to provide a semiconductor device that permits forming a gate insulating film having a desired breakdown voltage without increasing the number of manufacturing steps by applying the stepping process for forming an aligning mark to the formation of the anti-fuse and a method of manufacturing the particular semiconductor device.

According to a first aspect of the present invention, which permits achieving the object described above, there is provided a semiconductor device, comprising a concave portion formed in a semiconductor substrate, a first gate insulating film formed selectively on the semiconductor substrate, a second gate insulating film formed in at least the bottom surface of the concave portion, a first conductive film formed on the first gate insulating film, and a second conductive film formed on the second gate insulating film.

It is possible for the second gate insulating film and the second conductive film to be formed on the bottom surface of the concave portion, on at least one side surface of the concave portion and on the semiconductor substrate. It is also possible for the surface of the first conductive film to be flush with the surface of the second conductive film formed on the semiconductor substrate.

It is possible for the second gate insulating film to be formed in the corner portion of the concave portion.

It is also possible for an insulating film to be formed on the second conductive film and for the concave portion to be filled with the insulating film, the second gate insulating film and the second conductive film. Further, it is possible for the concave portion to be filled with the second gate insulating film and the second conductive film and for the surface of the second conductive film to be substantially flat.

It is possible for the semiconductor substrate to be an SOI substrate.

It is possible for the semiconductor device to further comprise an element isolating region formed within the semiconductor substrate such that the second gate insulating film and the second conductive film are allowed to extend over the element isolating region, a contact electrically connected to that portion of the second conductive film which is positioned on the element isolating region, and a wiring electrically connected to the contact.

It is possible for a plurality of concave portions to be formed in the semiconductor substrate such that these concave portions are filled with the second gate insulating film and the second conductive film and for the surface of the second conductive film to be substantially flat.

It is possible for a plurality of gate electrodes each consisting of the second conductive film to be formed in the concave portions.

It is possible for the impurity concentration in the second conductive film to be higher than that in the semiconductor substrate.

The second insulating film functions as the insulating film for the anti-fuse portion or for the capacitor element.

According to a second aspect of the present invention, there is provided a method of manufacturing a semiconductor device, comprising the steps of forming first, second and third concave portions in a semiconductor substrate; burying an insulating film in the first, second and third concave portions, followed by planarizing the surface of the insulating film until the surface of the semiconductor substrate is exposed to the outside so as to form an element isolating region within the first concave portion; removing the insulating film from the second and third concave portions so as to form a aligning mark portion in the second concave portion; forming a gate insulating film on the entire surface; forming a conductive film on the gate insulating film; and selectively removing the conductive film so as to form a first gate electrode on the semiconductor substrate, and to form a second gate electrode in the third concave portion.

It is possible to form a gate insulating film on the entire surface, with the insulating film formed within the third concave portion partly left unremoved.

It is possible to form the second gate electrode on the bottom surface of the third concave portion, on both side surfaces and one side surface of the third concave portion, and on the semiconductor substrate.

It is possible to form the second gate electrode in a manner to fill the third concave portion.

It is possible to form the second gate electrode in a manner to extend from within the third concave portion onto the element isolating region and to form the contact on that portion of the second gate electrode which is positioned on the element isolating region.

It is possible to form a plurality of third concave portions. It is also possible to form a plurality of second gate electrodes within the third concave portions.

It is possible for the impurity concentration of the conductive film to be higher than that of the semiconductor substrate.

The second gate electrode functions as the gate electrode for the anti-fuse portion or for the capacitor element.

As described above, the present invention provides a semiconductor device that permits forming a gate insulating film having a desired breakdown voltage without increasing the number of manufacturing steps by applying the stepping process for the aligning mark to the anti-fuse formation and a method of manufacturing the particular semiconductor device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 26 is a cross sectional view showing a semiconductor device having a capacitor element and prepared by a conventional technology;

FIG. 27A is a cross sectional view relating to a fifth embodiment of the present invention and showing a semiconductor device having a capacitor element;

FIG. 27B is a plan view showing the concave portion shown in FIG. 27A;

DETAILED DESCRIPTION OF THE INVENTION

Figure 1:
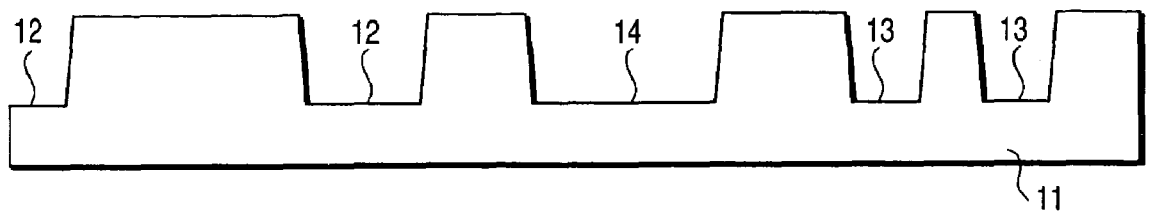
FIG. 1 is a cross sectional view showing a step of manufacturing a semiconductor device according to a first embodiment of the present invention.

Preferred embodiments of the present invention will now be described with reference to the accompanying drawings. Throughout the drawings, the common portions are denoted by common reference numerals.

FIRST EMBODIMENT

The method of manufacturing a semiconductor device according to a first embodiment of the present invention is featured in that a concave portion for an anti-fuse portion is formed simultaneously with formation of a concave portion (stepped portion) for an aligning mark portion. As a result, it is possible to effectively utilize the lithography step and the etching step in the formation of a concave portion for an aligning mark portion.

FIGS. 1 to 6 are cross sectional views collectively showing a method of manufacturing a semiconductor device according to the first embodiment of the present invention. The manufacturing method of a semiconductor device according to the first embodiment of the present invention will now be described with reference to these drawings.

In the first step, a first concave portion 12 forming an element isolating region is formed in a silicon substrate 11 by a lithography technology and a RIE (Reactive Ion Etching) method, as shown in FIG. 1. In this step, a second concave portion 13 forming an aligning mark portion, which is utilized in the subsequent lithography step, and a concave portion 14 for an anti-fuse portion are formed in the silicon substrate 11 simultaneously with formation of the first concave portion 12.

Figure 2:
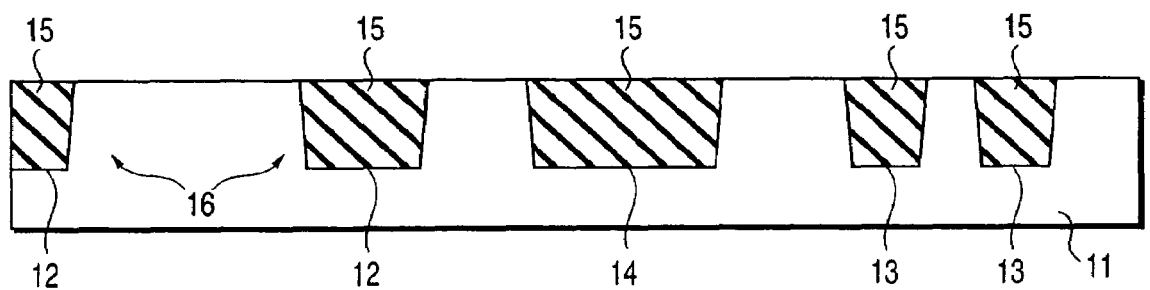
FIG. 2 is a cross sectional view showing the step following the step shown in FIG. 1 of manufacturing a semiconductor device according to a first embodiment of the present invention.

Then, a silicon oxide film 15 is formed on the entire surface so as to fill the first, second and third concave portions 12, 13 and 14, as shown in FIG. 2, followed by removing the silicon oxide film 15 by a CMP (Chemical Mechanical Polish) method until the surface of the silicon substrate 11 is exposed to the outside. As a result, an element isolating region 16 of an STI structure is formed in the first concave portion 12.

Figure 3:
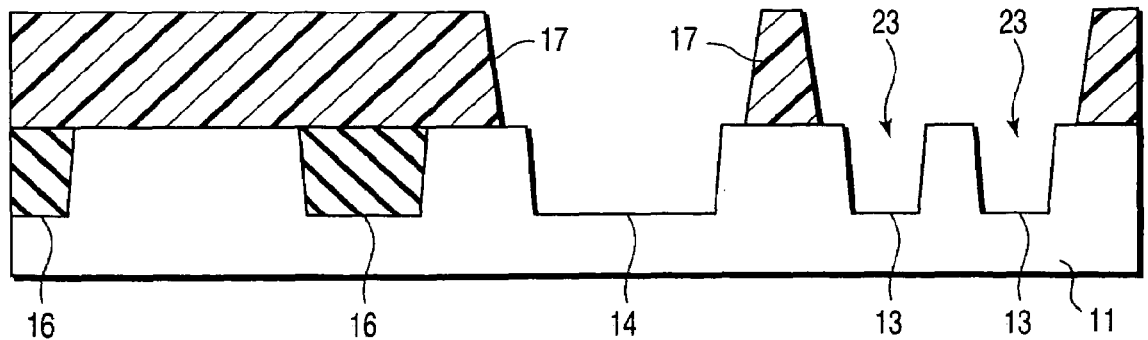
FIG. 3 is a cross sectional view showing the step following the step shown in FIG. 2 of manufacturing a semiconductor device according to a first embodiment of the present invention.

In the next step, a resist film 17 is formed on the entire surface, followed by patterning the resist film 17, as shown in FIG. 3. Then, the silicon oxide film 15 within the second concave portion 13 and the third concave portion 14 is removed by a wet etching performed by using the patterned resist film 17 as a mask, thereby an aligning mark portion 23 is formed in the second concave portion 13. Then, the patterned resist film 17 is removed.

Figure 4:
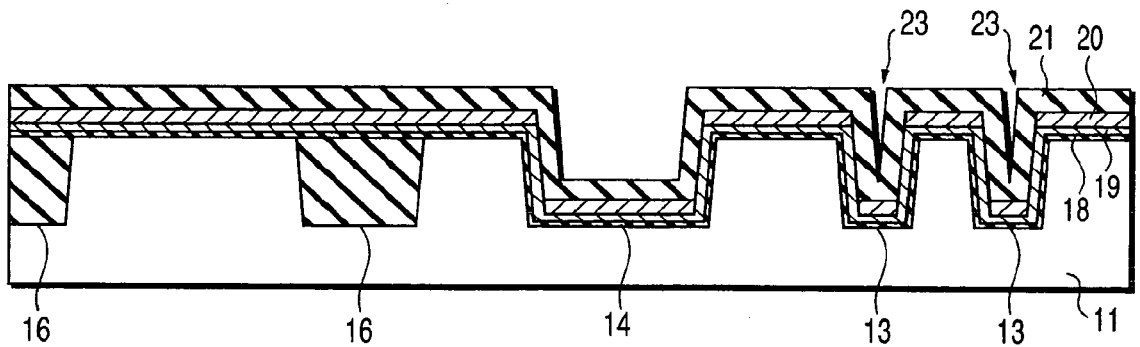
FIG. 4 is a cross sectional view showing the step following the step shown in FIG. 3 of manufacturing a semiconductor device according to a first embodiment of the present invention.

Then, a gate insulating film 18 is formed on the entire surface as shown in FIG. 4, followed by forming a polysilicon film 19 on the gate insulating film 18. The gate insulating film 18 is formed of any of, for example, a silicon oxide film, a silicon nitride film and a silicon oxynitride film. After formation of the polysilicon film 19, a tungsten film 20 is formed on the polysilicon film 19, followed by forming a silicon nitride film 21 on the tungsten film 20.

Figure 5:
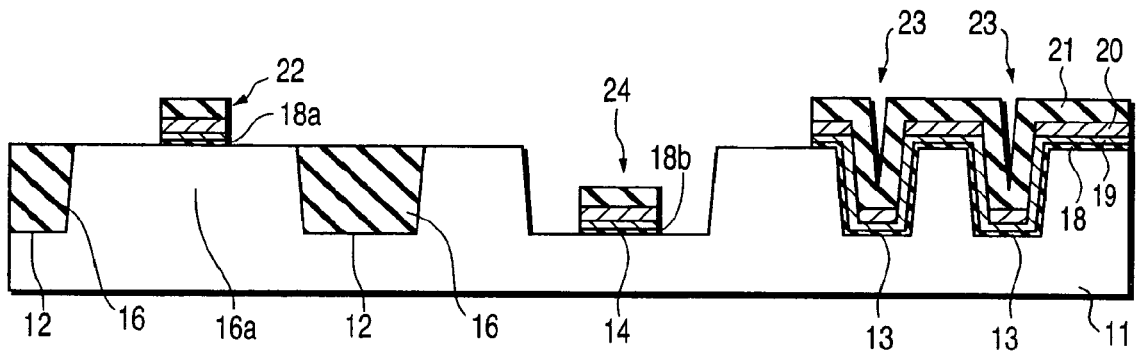
FIG. 5 is a cross sectional view showing the step following the step shown in FIG. 4 of manufacturing a semiconductor device according to a first embodiment of the present invention.

After formation of the silicon nitride film 21, the silicon nitride film 21, the tungsten film 20, the polysilicon film 19 and the gate insulating film 18 are selectively removed by the lithography technology and the RIE method, as shown in FIG. 5. As a result, a first gate electrode 22 is formed on a predetermined element region 16a. At the same time, a second gate electrode 24 for an anti-fuse portion is formed in a bottom surface of the third concave portion 14. Incidentally, the gate insulating film for the first gate electrode 22 is denoted by a reference numeral 18a. Likewise, the gate insulating film for the second gate electrode 24 is denoted by a reference numeral 18b. It is possible for the gate insulating film 18 not to be removed so as to remain on the entire substrate surface.

Figure 6:
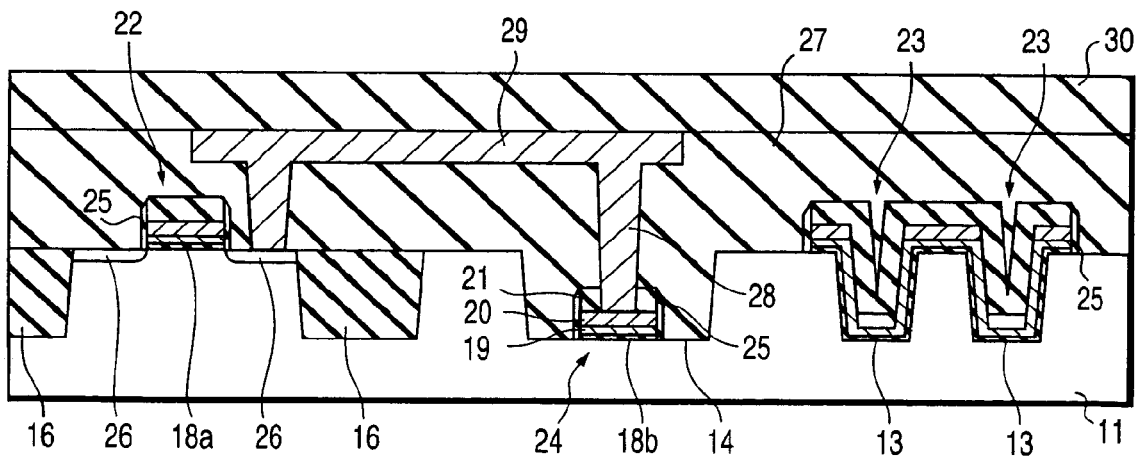
FIG. 6 is a cross sectional view showing the step following the step shown in FIG. 5 of manufacturing a semiconductor device according to a first embodiment of the present invention.

In the next step, a gate side wall 25 is formed on the side surfaces of the first and second gate electrodes 22 and 24, etc. by the known technology, as shown in FIG. 6, followed by forming source-drain regions 26 in surface regions of the silicon substrate 11 on both sides of the first gate electrode 22. Then, an interlayer insulating film 27 is formed on the entire surface, followed by forming a contact plug 28 and an upper wiring layer 29 for electrically connecting the second gate electrode 24 to another element. Finally, another interlayer insulating film 30 is formed on the entire surface.

According to the first embodiment of the present invention described above, the gate insulating film 18 for the anti-fuse is formed on a bottom surface of the third concave portion 14. It should be noted that damage is done to the bottom surface of the third concave portion 14 by the RIE process employed for forming the concave portions 12, 13 and 14. Therefore, it is possible to lower the breakdown voltage of the gate insulating film 18b formed in the concave portion 14, compared with the gate insulating film 18a of the transistor formed on the surface of the substrate 11. It follows that it is possible to break only the gate insulating film 18b for the anti-fuse without applying an extremely high voltage. This makes it possible to suppress the damage done to the gate insulating film 18a of the transistor included in, for example, a judging circuit portion. It follows that it is possible to maintain a high reliability of the transistor and to improve the yield.

It should also be noted that the concave portion 14 for the anti-fuse portion is also formed in the lithography and etching steps for forming the concave portion 13 for the aligning mark portion 23, and the gate insulating film 18a for the transistor is formed simultaneously with formation of the gate insulating film 18b for the anti-fuse portion. As a result, it is unnecessary to employ additional manufacturing steps for forming the anti-fuse portion. It follows that the manufacturing cost of the semiconductor device can be lowered.

In the first embodiment, the lower end portion of the resist film 17 for forming the third concave portion 14 for the anti-fuse, which is shown in FIG. 3, is positioned outside the upper edge portion of the third concave portion 14. Therefore, the silicon oxide film 15 within the third concave portion 14 is removed completely in the etching step. However, the positional relationship between the third concave portion 14 and the lower end portion of the resist film 17 is not limited to that shown in the drawing.

Figure 7:
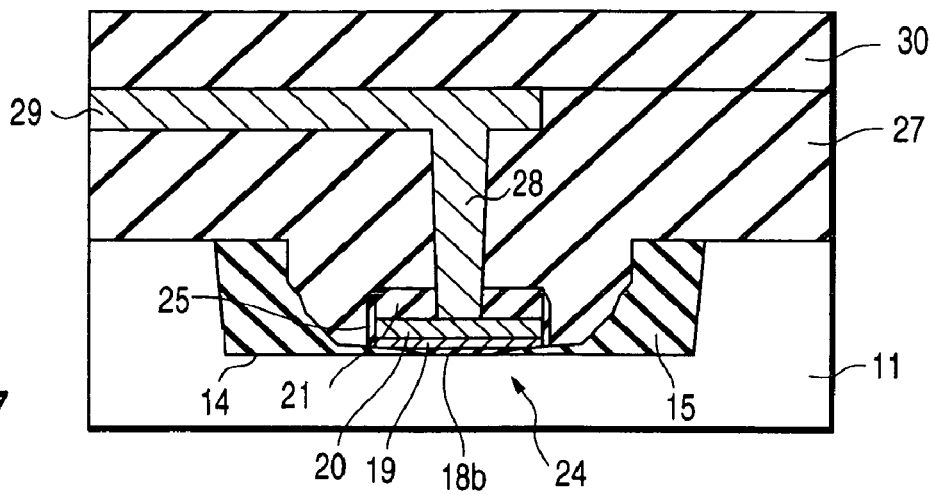
FIG. 7 is a cross sectional view showing a manufacturing process of a semiconductor device according to a modification of the first embodiment of the present invention.

For example, where the lower end portion of the resist film 17 is positioned inside the upper edge portion of the third concave portion 14, it is possible to permit the silicon oxide film 15 to remain partly within the third concave portion 14, as shown in FIG. 7. It should be noted that, in the step of forming the gate electrode, damage is done to the gate insulating film in the edge portion of the gate electrode in the step of, for example, the RIE process, making it impossible to adjust completely the nonuniformity in the breakdown voltage of the gate electrode. However, in the structure shown in FIG. 7, the remaining silicon oxide film 15 resides in the edge portion of the gate electrode 24. It follows that the breakdown at the edge portion of the gate electrode 24 can be suppressed by the insulating film formed of the silicon oxide film 15, making it possible to adjust the nonuniformity in the breakdown voltage of the gate insulating film 18b.

SECOND EMBODIMENT

In the second embodiment, the shape of the gate electrode for the anti-fuse is modified in order to positively utilize the corner portion of the concave portion for the anti-fuse. Incidentally, the manufacturing method according to the second embodiment is substantially equal to that according to the first embodiment and, thus, the following description covers only the structure differing from that in the first embodiment.

Figure 8:
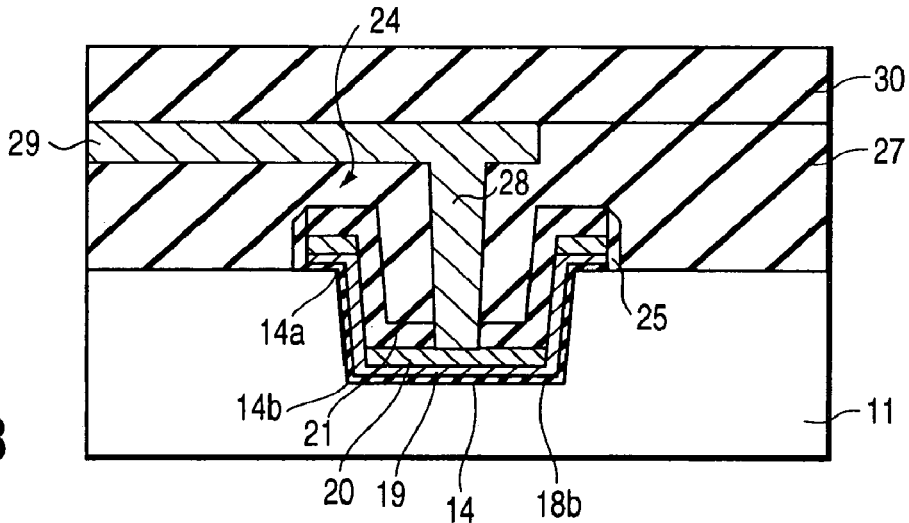
FIG. 8 is a cross sectional view relating to a second embodiment of the present invention and showing an anti-fuse portion utilizing a corner portion of a concave portion.
Figure 9:
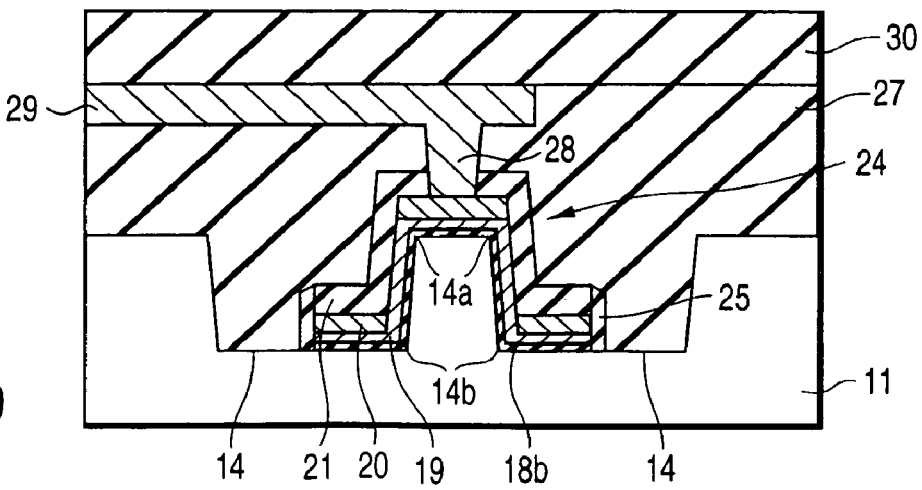
FIG. 9 is a cross sectional view relating to the second embodiment of the present invention and showing another anti-fuse portion utilizing a corner portion of a concave portion.

As shown in FIG. 8, the gate electrode 24 is formed on the bottom surface and the side surface of the concave portion 14 and on the semiconductor substrate 11 for covering corner portions 14a, 14b of the concave portion 14 for the anti-fuse.

Where a plurality of concave portions 14 are formed as shown in FIG. 9, the gate electrode 24 is formed on the bottom surfaces and side surfaces of the concave portions 14 and on the semiconductor substrate 11 in a manner to cover the plural concave portions 14 for covering the corner portions 14a, 14b of the concave portion 14 for the anti-fuse.

According to the second embodiment, the corner portions 14a and 14b of the concave portion 14 are used as the anti-fuse. Therefore, the electric field concentration occurs on particularly the corner portions 14a and 14b so as to make it possible to break effectively the gate insulating film 18b.

Figure 10:
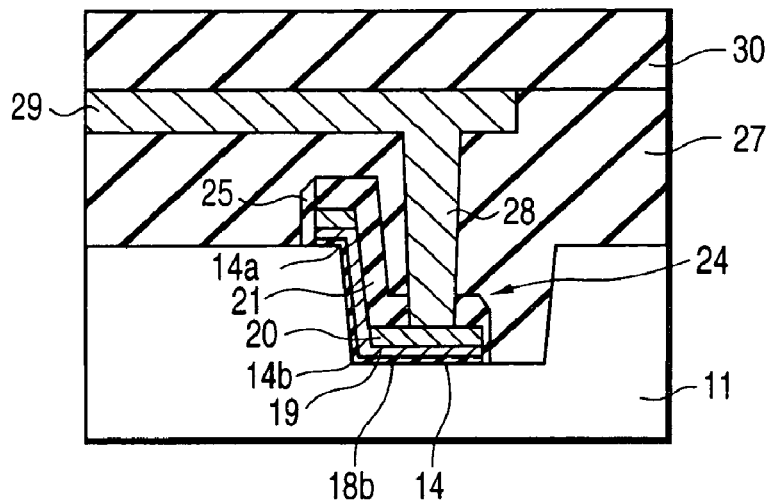
FIG. 10 is a cross sectional view relating to the second embodiment of the present invention and showing an anti-fuse portion utilizing a corner portion on one side of a concave portion.

Also, it is possible to form the gate electrode 24 on the corner portions 14a, 14b on only one side of the concave portion 14, as shown in FIG. 10. In this case, it is possible to obtain the effect of diminishing the area occupied by the anti-fuse in addition to the effects described above.

Also, where the gate insulating film 18b is formed by, for example, oxidation in place of the deposition, the gate insulating film (oxide film) 18b can be made thinner in the corner portions 14a, 14b than in the other flat portion, making it possible to lower specifically the breakdown voltage in only the corner portions 14a, 14b.

As described above, according to the second embodiment, the breakdown voltage can be made lower than in the first embodiment in only the anti-fuse portion of the specified portion (corner portions 14a, 14b). As a result, the damage done to the other transistors can be further suppressed so as to improve the reliability of the semiconductor device and the yield.

Figure 11:
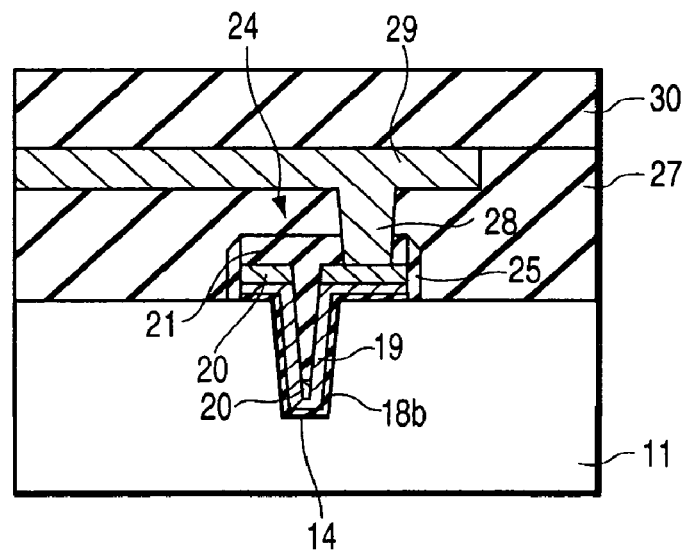
FIG. 11 is a cross sectional view relating to the second embodiment of the present invention and showing an anti-fuse portion in the case of filling the concave portion.
Figure 12:
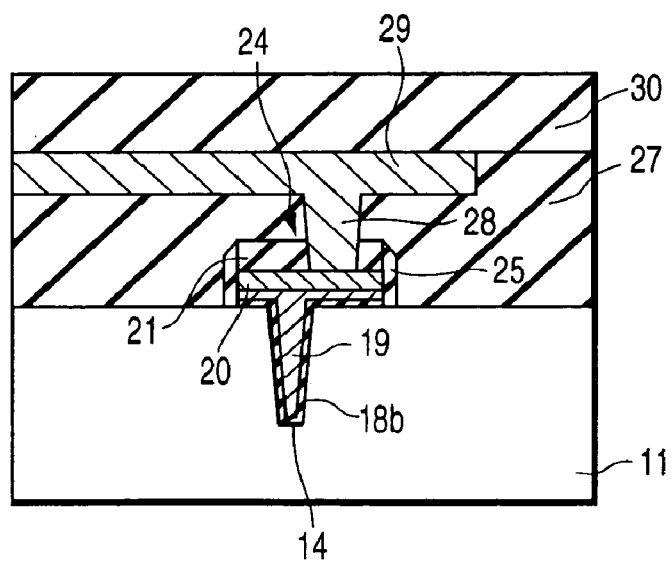
FIG. 12 is a cross sectional view relating to the second embodiment of the present invention and showing an anti-fuse portion in the case of filling the concave portion with a polysilicon film.

Incidentally, in the second embodiment of the present invention, it is possible to form the concave portion 14 having a width smaller than that of the concave portion 14 shown in FIGS. 8 and 9 and to fill the concave portion 14 with a gate electrode material (polysilicon film 19), as shown in FIGS. 11 and 12. Where the polysilicon film 19 is thin as shown in FIG. 11, the concave portion 14 is not filled completely with the polysilicon film 19, giving rise to formation of a concavity in the central portion of the polysilicon film 19. In this case, the concavity of the polysilicon film 19 is filled with an insulating film (silicon nitride film 21) providing the cap film of the gate electrode. Also, where the polysilicon film 19 has a sufficiently large thickness, the concave portion 14 is filled completely with the polysilicon film 19, as shown in FIG. 12. Therefore, the silicon nitride film 21 covers the tungsten film 20 formed on the outside of the concave portion 14.

It should be noted that the polysilicon film 19 and the silicon nitride film 21 are formed in many cases by, for example, an LPCVD (Low Pressure Chemical Vapor Deposition) method that is carried out under high temperatures, e.g., several hundred □. Therefore, stress derived from the difference in the thermal expansion coefficient is generated under room temperature under which the semiconductor device is actually used. It follows that the breakdown voltage of the anti-fuse portion can be further lowered, compared with the semiconductor device shown in, for example, FIGS. 8 and 9. It should also be noted that, since the gate electrode 24 extends onto the silicon substrate 11, the gate electrodes 22 and 24 for the transistor and the anti-fuse could be formed in the same height in the lithography step for forming the gate electrodes 22 and 24. This facilitates the lithography step and further improves the yield. Incidentally, the structure shown in FIG. 12 produces the effect that a position alignment between the contact plug 28 and the tungsten film 20 is easy, compared with the structure shown in FIG. 11.

In each of the first and second embodiments of the present invention described above, the silicon substrate 11 is used as the semiconductor substrate. However, the semiconductor substrate used in the present invention is not limited to the silicon substrate 11. For example, it is also possible to use as the semiconductor substrate an SOI (Silicon On Insulator) substrate 31 consisting of an insulating layer 31a and a silicon layer 31b, as shown in FIG. 13.

Figure 14:
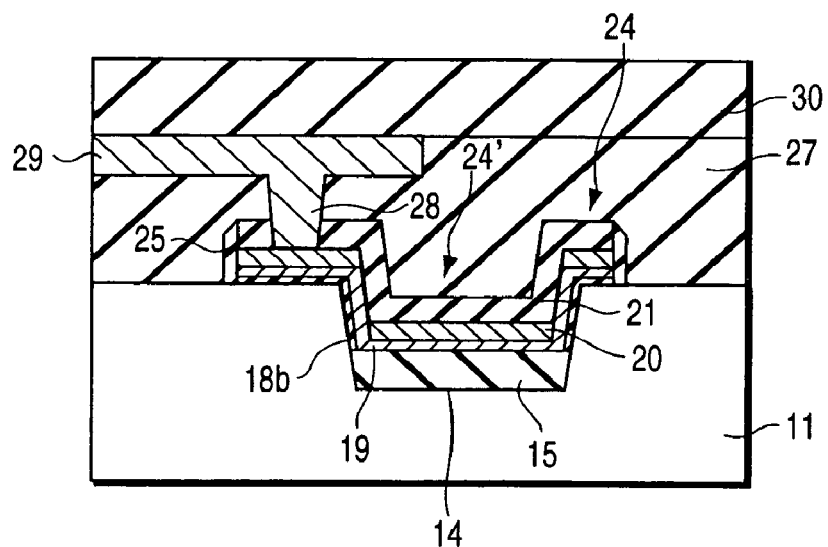
FIG. 14 is a cross sectional view relating to the first and second embodiments of the present invention and showing an anti-fuse portion in the case where the concave portion is partly filled with a silicon oxide film.

In each of the first and second embodiments of the present invention described above, the silicon oxide film 15 within the concave portion 14 is removed completely in the stepping process shown in FIG. 3. However, it is not absolutely necessary in the present invention to remove completely the silicon oxide film 15 within the concave portion 14. For example, it is also possible to leave the silicon oxide film 15 unremoved in a part of the concave portion 14, as shown in FIG. 14. In this case, even if damage is done to the bottom surface of the concave portion 14 in the RIE step for forming the concave portion 14, it is possible to suppress the nonuniformity in the breakdown voltage of the gate insulating film by forming the silicon oxide film 15 on the bottom surface of the concave portion 14 after formation of the concave portion 14.

Figure 13:
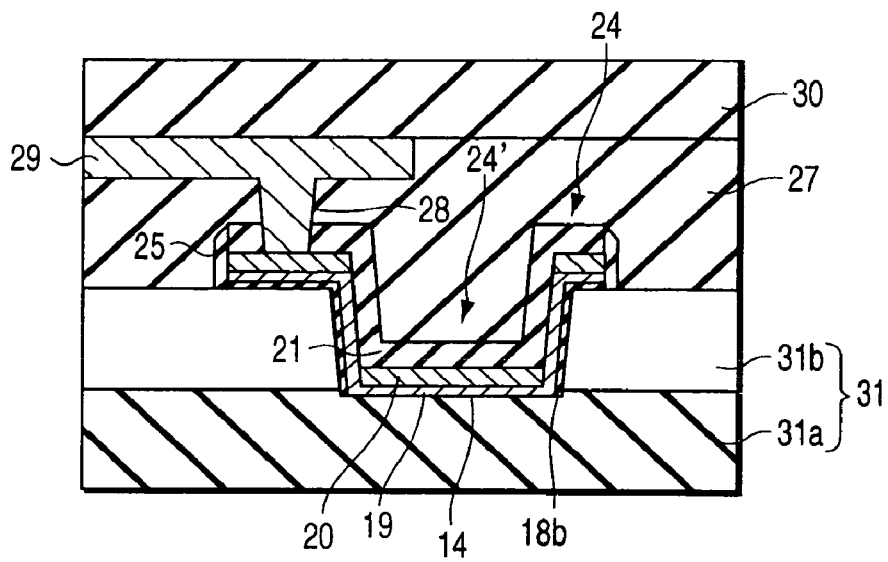
FIG. 13 is a cross sectional view relating to the first and second embodiments of the present invention and showing an anti-fuse portion in the case of using an SOI substrate.

Incidentally, where the width of the concave portion 14 is relatively large and the gate electrode 24 is formed on the bottom surface and side surface of the concave portion 14 and on the silicon substrate 11 as shown in FIGS. 13 and 14, a stepped portion 24' of the gate electrode 24 is formed in the center of the concave portion 14. Therefore, the area occupies by the element can be further diminished, if the stepped portion 24' is utilized as an aligning mark portion.

Figure 15:
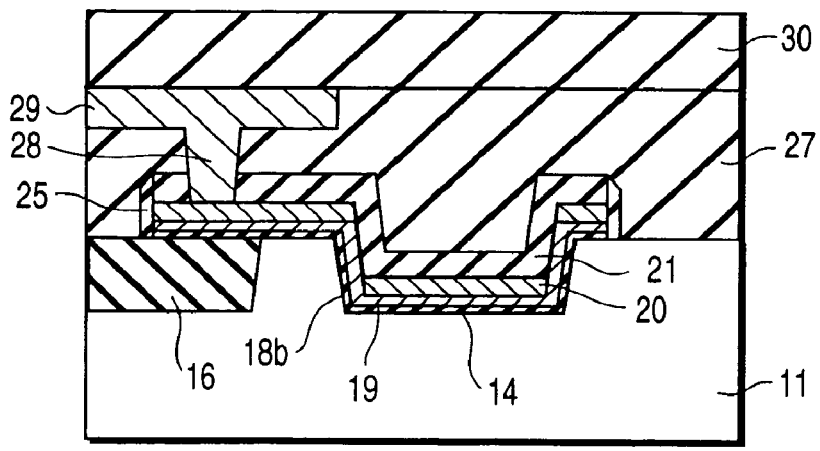
FIG. 15 is a cross sectional view relating to the first and second embodiments of the present invention and showing an anti-fuse portion in the case of forming a contact on the element isolating region.

Also, as shown in FIG. 15, it is possible to form the contact plug 28 for the electrical connection to the gate electrode (not shown) of another element above the element isolating region 16. Where a contact hole is formed on an element region, damage is done to the gate insulating film right under the contact hole in the RIE step for forming the contact hole, giving rise to a possibility of generating nonuniformity in the breakdown voltage. In the case of the structure shown in FIG. 15, however, it is possible to suppress the nonuniformity in the breakdown voltage derived from the damage generated in the step of forming the contact hole because the contact hole is formed above the element isolating region.

Figure 16:
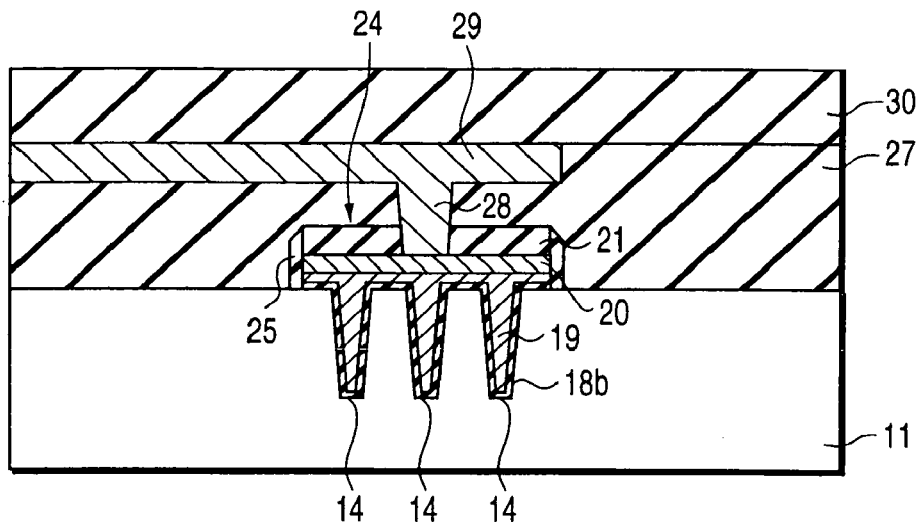
FIG. 16 is a cross sectional view relating to the first and second embodiments of the present invention and showing the case where a plurality of concave portions correspond to a single anti-fuse portion.
Figure 17:
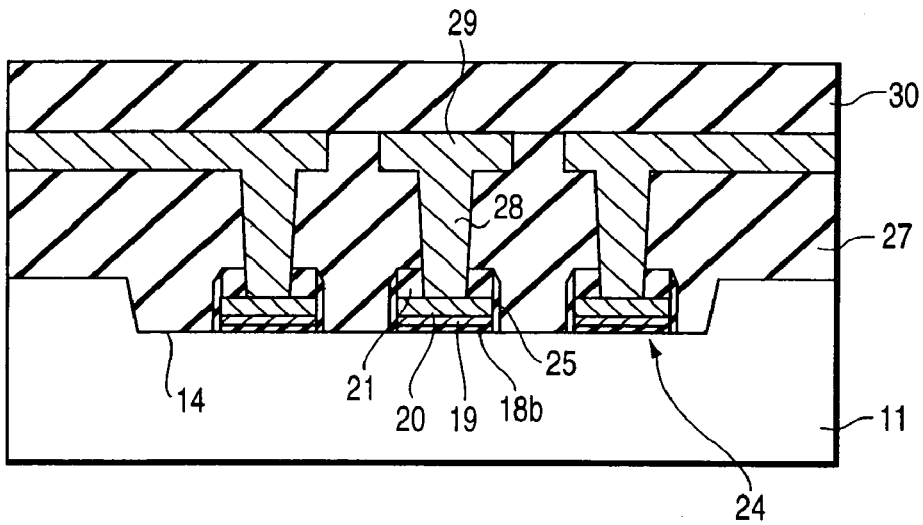
FIG. 17 is a cross sectional view relating to the first and second embodiments of the present invention and showing the case where a single concave portion corresponds to a plurality of anti-fuse portions.

In each of the first and second embodiments of the present invention described above, the gate electrode 24 for the anti-fuse and the concave portion 14 correspond to each other in a 1:1 relationship. However, the present invention is not limited to these embodiments. For example, it is possible to form a plurality of concave portions 14 in a manner to correspond to a single gate electrode 24, as shown in FIG. 16. In this case, the breakdown voltage is stabilized, and the yield of the anti-fuse is improved. It is also possible to form a plurality of gate electrodes 24 within a single concave portion 14, as shown in FIG. 17. In this case, the area occupied by the anti-fuse portion can be further diminished.

THIRD EMBODIMENT

In forming a transistor, e.g., when it comes to a CMOS (Complementary MOS) device using a polysilicon gate, an N-type or P-type ion implantation is performed in the steps for forming the well, the channel region, the gate electrode, the source-drain regions and the LDD (Lightly Doped Drain) region. In the third embodiment, the breakdown voltage of the gate insulating film in the anti-fuse portion is adjusted by utilizing these steps in combination. The method of adjusting the breakdown voltage of the gate insulating film in the anti-fuse portion and the method of decreasing the resistance of the conductive portion after the breakdown will now be described in the following.

Figure 18:
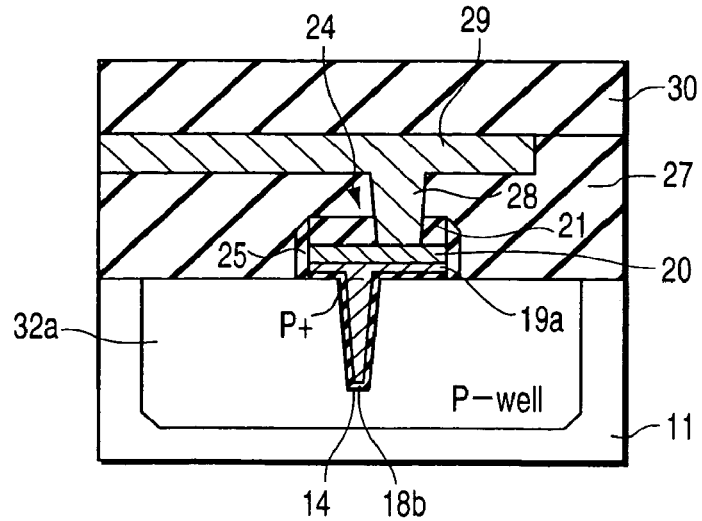
FIG. 18 is a cross sectional view relating to a third embodiment of the present invention and showing an anti-fuse portion in which the impurity concentration in the gate is higher than that in the well.

As shown in FIG. 18, the conductivity type, e.g., P-type, of a well 32a formed in a surface region of the silicon substrate 11 is made equal to that of a polysilicon film 19a. As a result, it is possible to lower the resistance of the anti-fuse portion after breakdown of the gate insulating film 18b so as to improve the accuracy of judgment of breakdown/non-breakdown.

Figure 19:
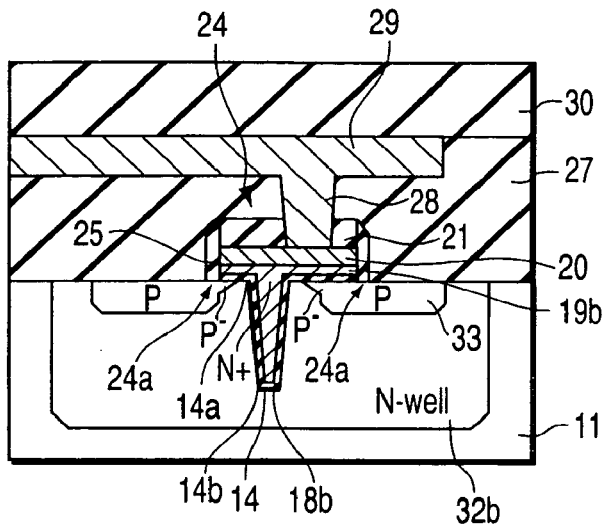
FIG. 19 is a cross sectional view relating to the third embodiment of the present invention and showing an anti-fuse portion in which the impurity concentration in the gate is higher than that in the well, and an LDD region is formed.

As shown in FIG. 19, the conductivity type, e.g., N-type, of the well 32 formed in a surface region of the silicon substrate 11 is made equal to that of the polysilicon film 19b. Further, a P-type LDD region and source-drain regions 33 are formed in surface regions of the N-well 32b. For breaking down the gate insulating film 18b, a positive electric field is applied to the gate electrode 24. In this case, the electric field concentration on the edge portions 24a of the gate electrode 24 can be moderated by the formation of the LDD region and the source-drain regions 33. It follows that it is possible to suppress the nonuniformity in the breakdown voltage derived from the electric field concentration on the gate electrode edge portions 24a.

Figure 20:
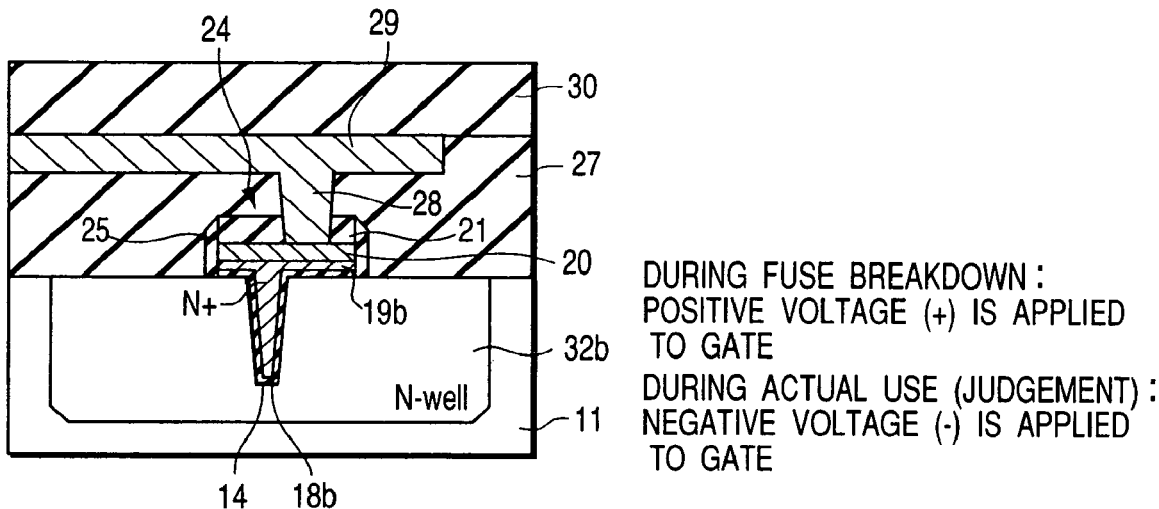
FIG. 20 is a cross sectional view relating to the third embodiment of the present invention and showing an anti-fuse portion in which the impurity concentration in the gate is higher than that in the well.

Also, as shown in FIG. 20, the conductivity, e.g., N-type, of the well 32b formed in a surface region of the silicon substrate 11 is made equal to that of the polysilicon film 19b, and the impurity concentration in the polysilicon film 19b is made higher by at least one place than that in the well 32b. Incidentally, in this apparatus, a positive electric field is imparted to the gate electrode 24 in breaking down the gate insulating film 18b in the anti-fuse portion, and a negative electric field is imparted to the gate electrode 24 when the apparatus is actually used for performing the judgment. Where the polarities of the electric field in the breakdown step and the judging step are made opposite to each other, the depletion layer formed in the well 32b on the lower side of the gate is thickened in the judging step because the impurity concentration in the well 32b is lower than that in the polysilicon film 19b. As a result, only an effectively low electric field is applied to the gate insulating film in the anti-fuse portion that was not broken down. It follows that it is possible to increase the reliability of the judging operation that is repeatedly performed in actually using the apparatus.

Figure 21:
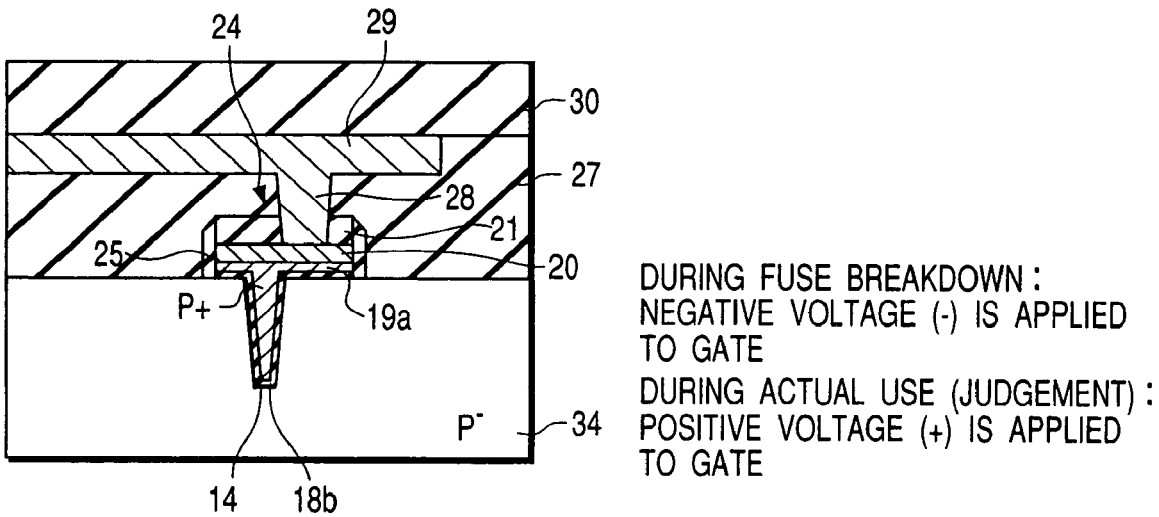
FIG. 21 is a cross sectional view relating to the third embodiment of the present invention and showing an anti-fuse portion in which the impurity concentration in the gate is higher than that in the well.

Also, in each of the embodiments described above, it is possible to implant a channel impurity into a region right under the gate electrode 24 in the anti-fuse portion in accordance with formation of a transistor. Alternatively, it is also possible to keep, for example, the P-type semiconductor substrate 34 under the state of a low impurity concentration as shown in FIG. 21 without applying an ion implantation to the well and the channel region of the anti-fuse portion. Where the gate insulating film 18b in the anti-fuse portion is broken down in this apparatus, a negative electric field is imparted to the gate electrode 24, and a positive electric field is imparted to the gate electrode 24 in performing the judging operation. The effect similar to that obtained in the structure shown in FIG. 20 can be obtained in this case, too. Further, since the original impurity concentration in the semiconductor substrate 34 itself is very low, the thickness of the depletion layer can be further increased so as to further improve the reliability of the judging operation in actually using the apparatus.

The method of adjusting the breakdown voltage of the gate insulating film 18b in the anti-fuse portion is not limited to that described in the embodiment described above.

For example, it is possible to adjust the breakdown voltage of the anti-fuse by adjusting the amount of damage done to the bottom portion, the side surface and the corner portions of the concave portion 14. To be more specific, where the breakdown voltage is rendered lower than a predetermined value, and where the decrease of the breakdown voltage is derived from the damage caused by the RIE treatment, it is possible to decrease the amount of the damage by decreasing the ion energy in the RIE step. As a result, the breakdown voltage can be restored to some extent.

Also, the damaged layer in the uppermost surface of the silicon substrate 11 can be removed by etching thin the surface of the silicon substrate 11 by an isotropic etching such as a CDE (Chemical Dry Etching) method in removing the silicon oxide film 15 in the stepping process shown in FIG. 3. It is also possible to weaken the effect of the electric field concentration by rounding the corner portions 14a and 14b of the concave portion 14. The breakdown voltage rendered lower than a predetermined value can be restored to some extent by these methods, too.

By contrast, where it is desired to further lower the breakdown voltage, it is possible to further introduce damages to the bottom surface of the concave potion 14 by using a RIE method having a high power in place of the wet etching method in removing the silicon oxide film 15 in the stepping process.

Further, after removal of the silicon oxide film 15 in the stepping process, an impurity ion is introduced by using the ion implantation technology before the resist film 17 is peeled off. As a result, it is possible to control the thickness of the gate oxide film 18 formed in the subsequent process. It follows that it is possible to control the breakdown voltage of the gate insulating film 18b. For example, after the lithography process for the stepping, a nitrogen ion implantation is performed. Thereby it is possible to form the thin thickness of the gate oxide film 18 formed in the subsequent process, it is possible to gain the breakdown voltage of the predetermined value by the film 18 being used as anti-fuse. In this case, the stepped portion of the anti-fuse portion is not always a necessity, however it is possible to lower the breakdown voltage by the stepped portion.

FOURTH EMBODIMENT

The fourth embodiment is directed to the plan views of the semiconductor devices according to the first to third embodiments of the present invention. Incidentally, a reference numeral 14c shown in each of FIGS. 22A to 25A denotes a mask.

Figure 22A:
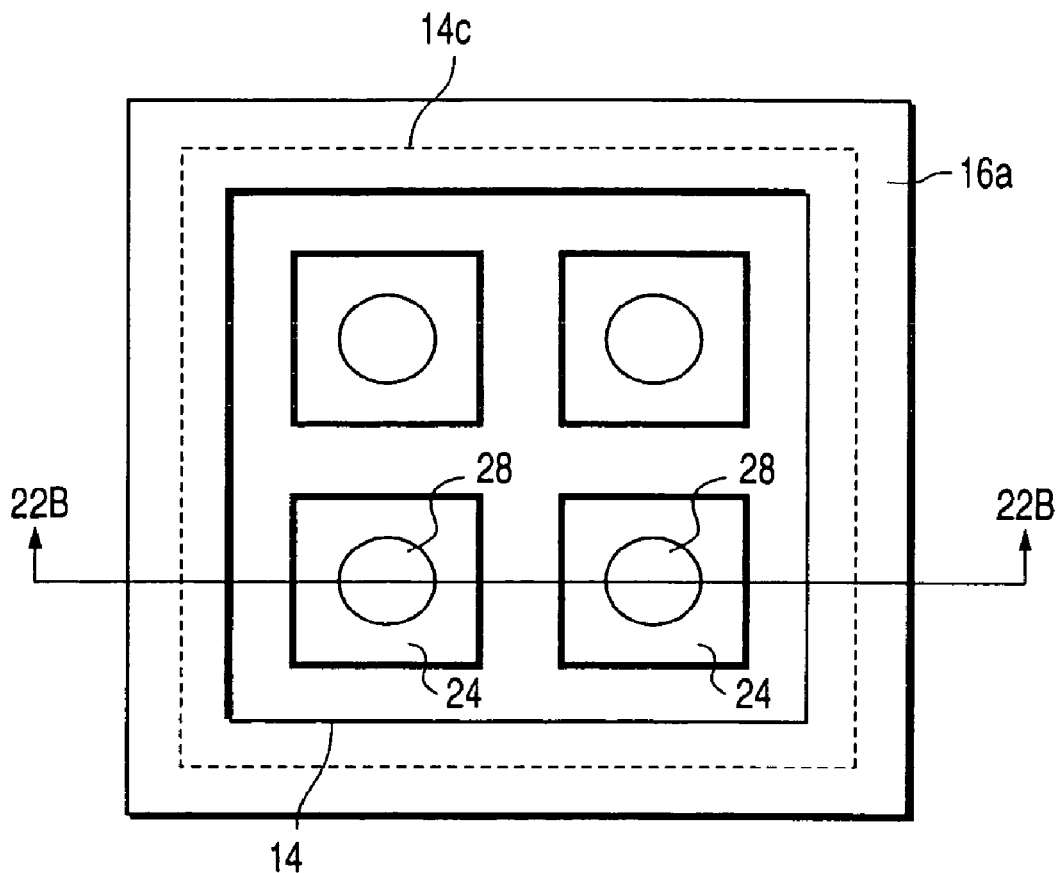
FIG. 22A is a plan view showing the case where a gate electrode for a plurality of anti-fuses is formed in a single concave portion.
Figure 22B:
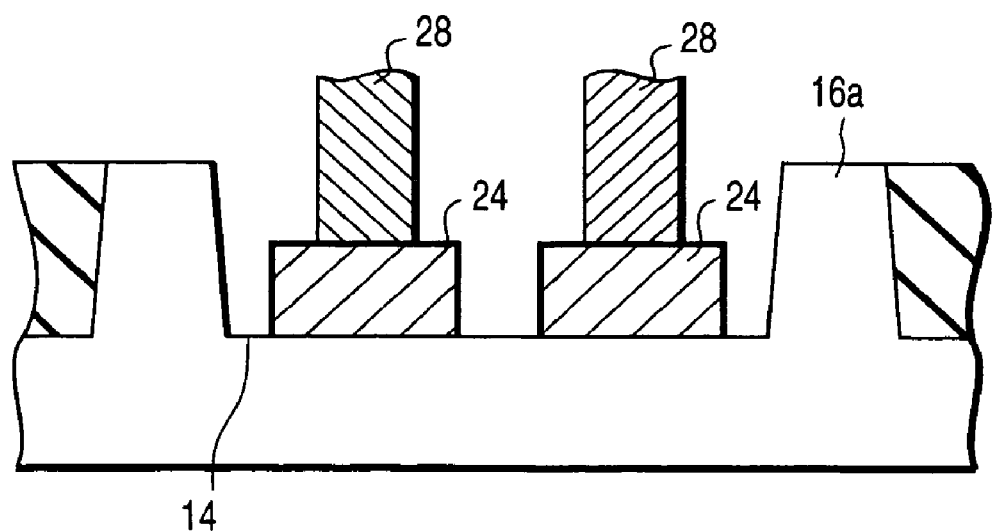
FIG. 22B is a cross sectional view along the line 22B-22B shown in FIG. 22A.

FIG. 22A is a plan view covering the case where a plurality of gate electrodes 24 for the anti-fuse are formed in a single concave portion 14 as shown in FIG. 17. FIG. 22B is a cross sectional view along the line 22B-22B shown in FIG. 22A. In this case, the gate electrodes 24 are formed in the form of islands within the concave portion 14.

Figure 23A:
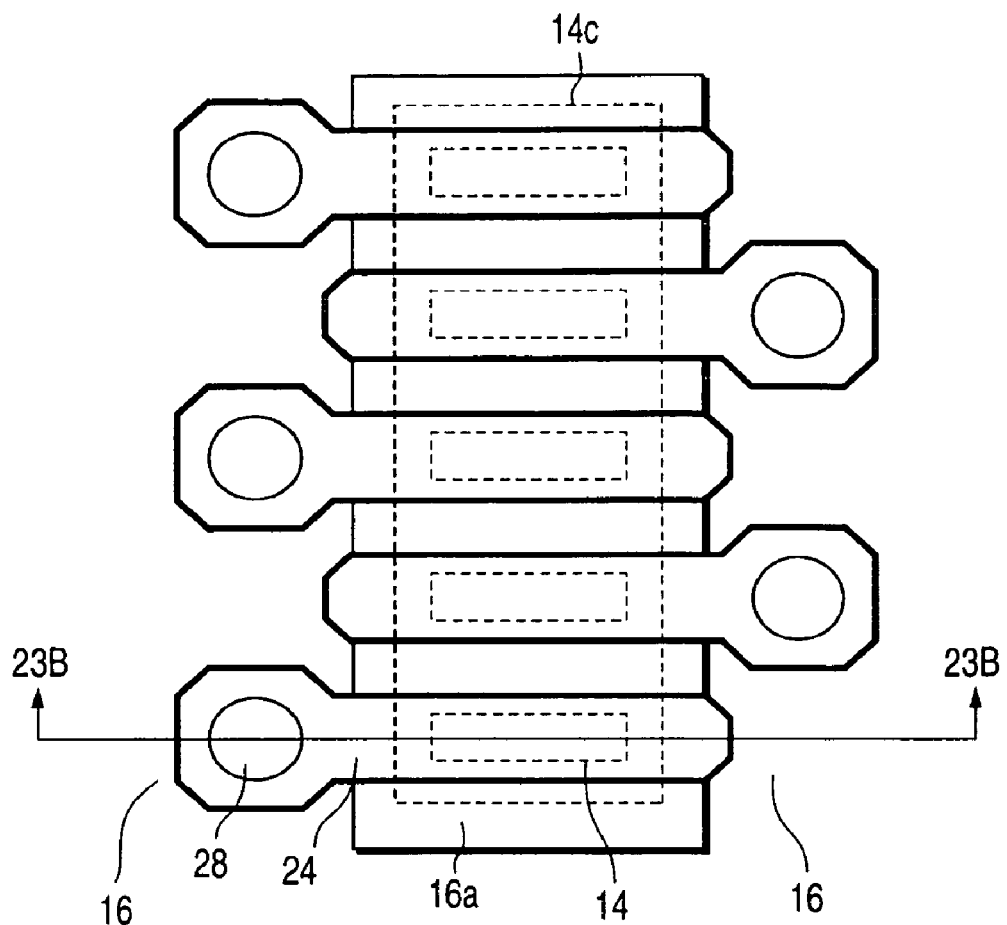
FIG. 23A is a plan view showing the case where a concave portion is filled with a gate electrode for an anti-fuse and a contact is formed on an element isolating region.
Figure 23B:
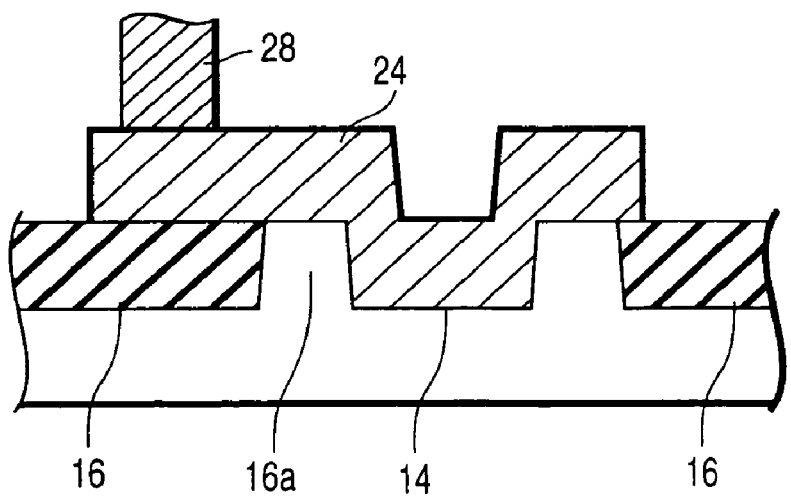
FIG. 23B is a cross sectional view along the line 23B-23B shown in FIG. 23A.

FIG. 23A is a plan view covering the case where the concave portion 14 is filled with the gate electrode 24, and the contact plug 28 is formed above the element isolating region 16, as shown in FIG. 15. FIG. 23B is a cross sectional view along the line 23B-23B shown in FIG. 23A.

Figure 24A:
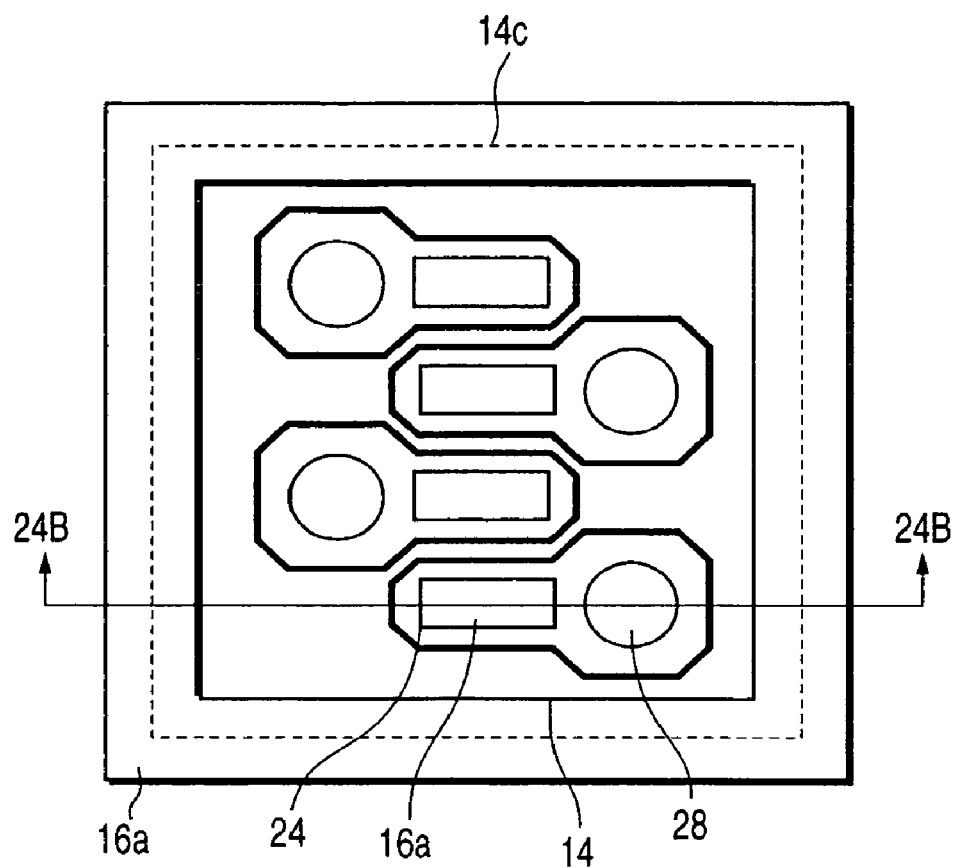
FIG. 24A is a plan view showing the case where the corner portion of a concave portion is positively utilized.
Figure 24B:
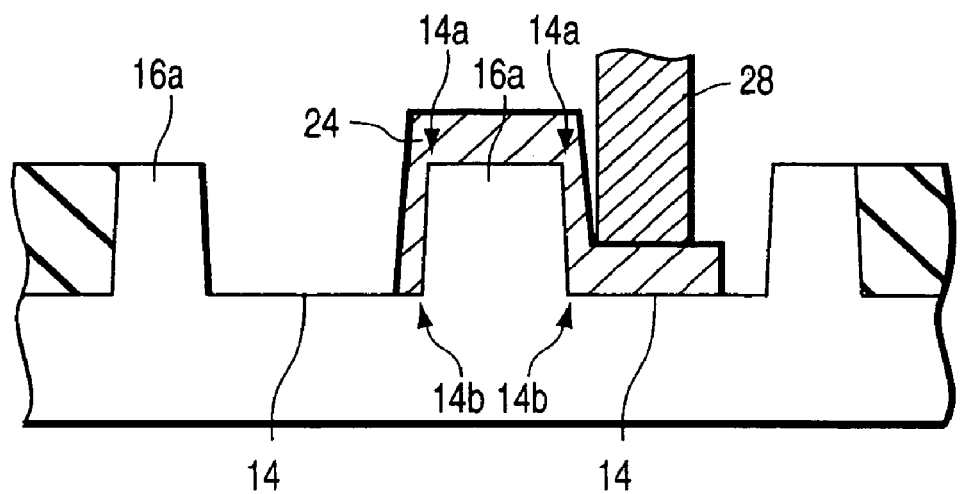
FIG. 24B is a cross sectional view along the line 24B-24B shown in FIG. 24A.

FIG. 24A is a plan view covering the case where the corner portions 14a, 14b of the concave portion 14 are positively utilized as shown in FIGS. 8 to 10. FIG. 24B is a cross sectional view along the line 24B-24B shown in FIG. 24A.

Figure 25A:
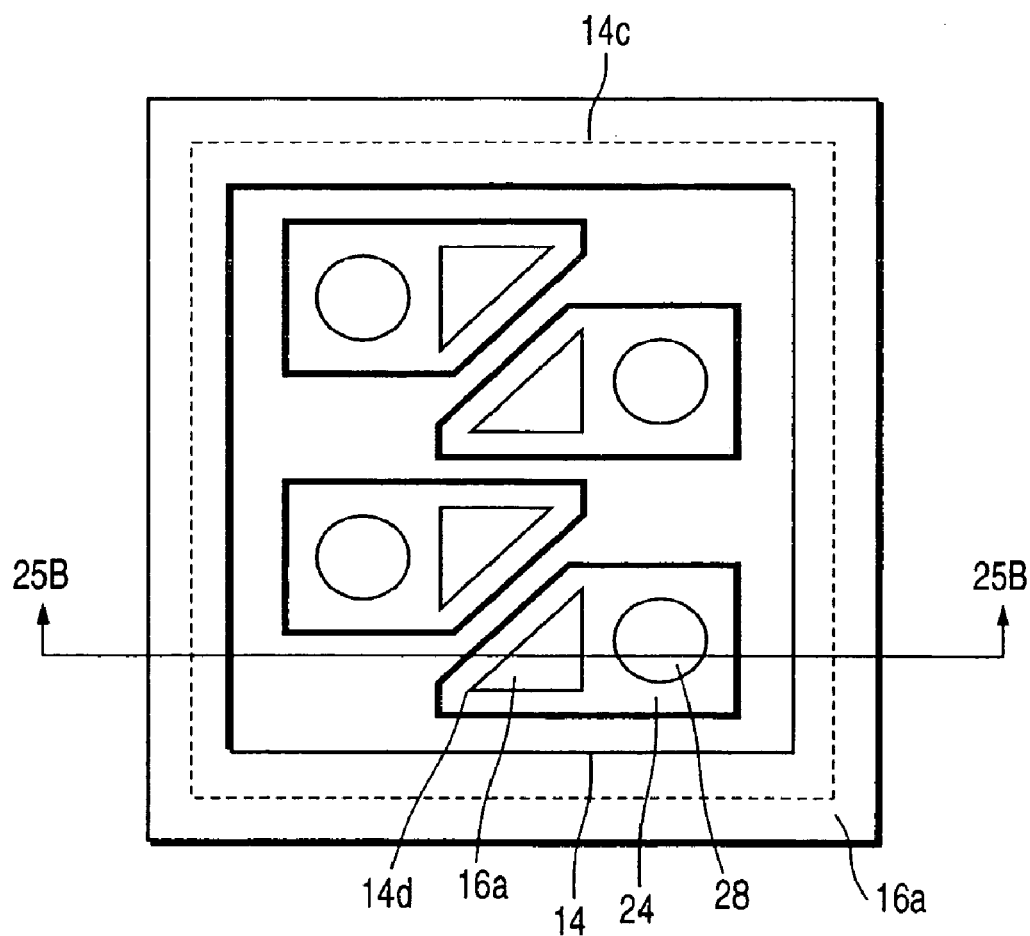
FIG. 25A is a plan view showing the case where an acute angle portion is formed in a concave portion.
Figure 25B:
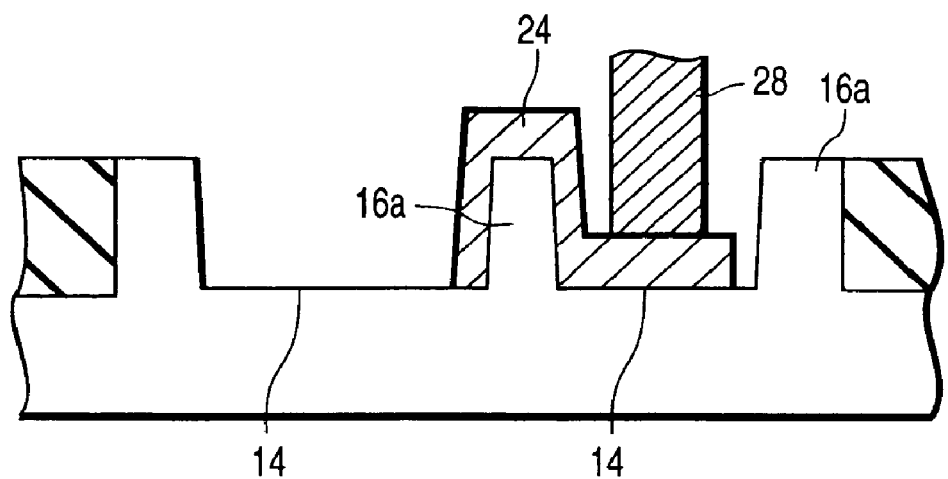
FIG. 25B is a cross sectional view along the line 25B-25B shown in FIG. 25A.
Figure 28:
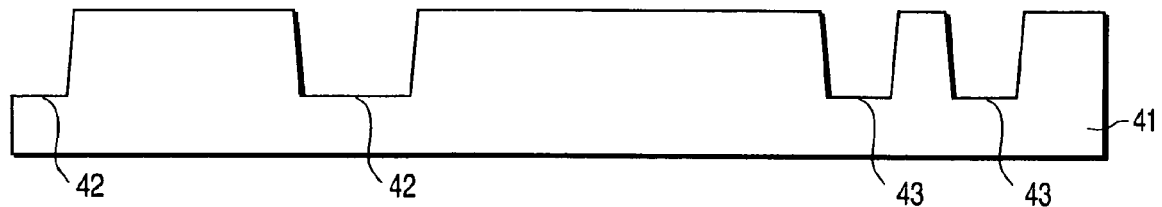
FIG. 28 is a cross sectional view showing a manufacturing step of a conventional semiconductor device.
Figure 29:
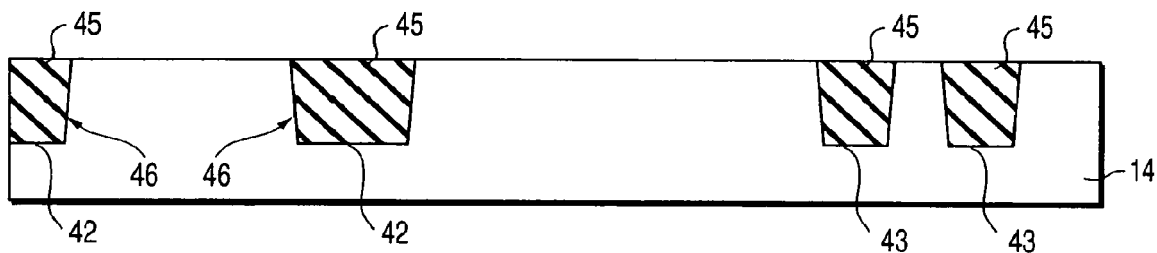
FIG. 29 is a cross sectional view showing the step following the step shown in FIG. 28 of manufacturing the conventional semiconductor device.
Figure 30:
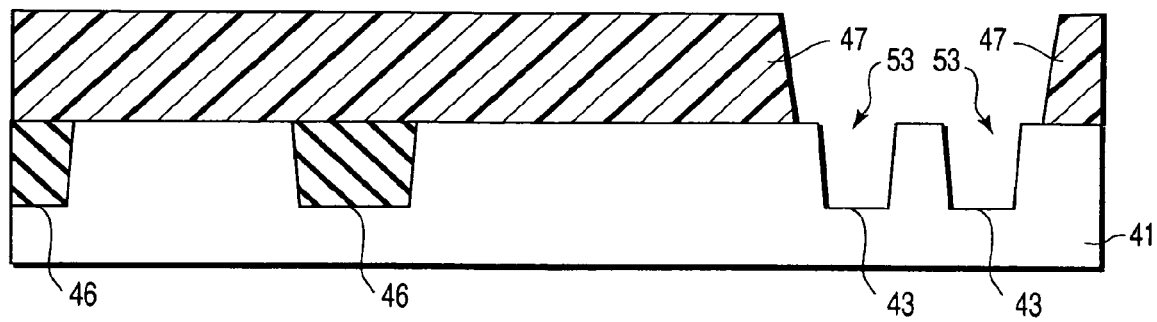
FIG. 30 is a cross sectional view showing the step following the step shown in FIG. 29 of manufacturing the conventional semiconductor device.
Figure 31:
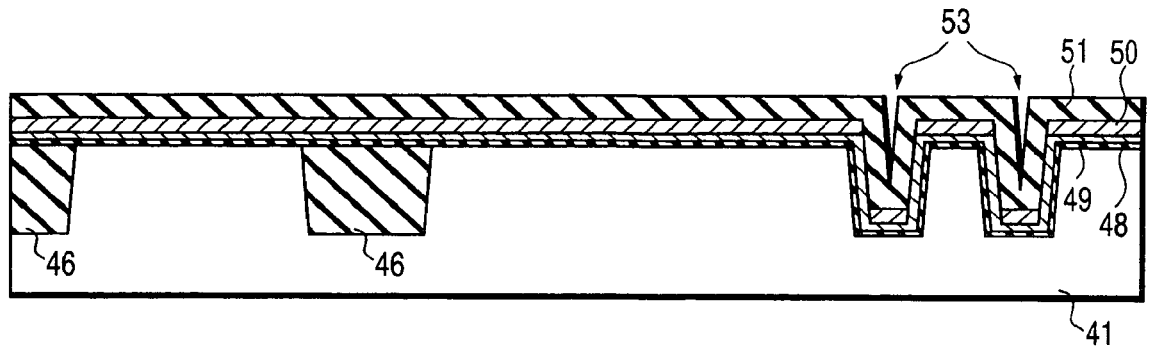
FIG. 31 is a cross sectional view showing the step following the step shown in FIG. 30 of manufacturing the conventional semiconductor device.
Figure 32:
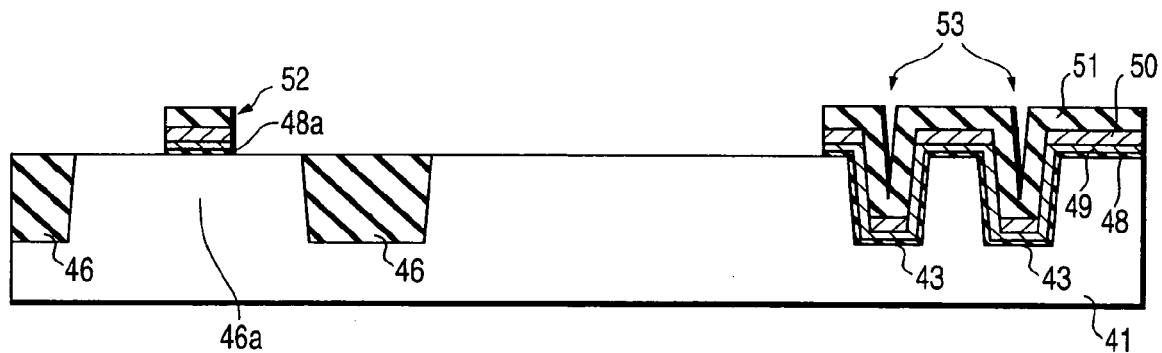
FIG. 32 is a cross sectional view showing the step following the step shown in FIG. 31 of manufacturing the conventional semiconductor device.
Figure 33:
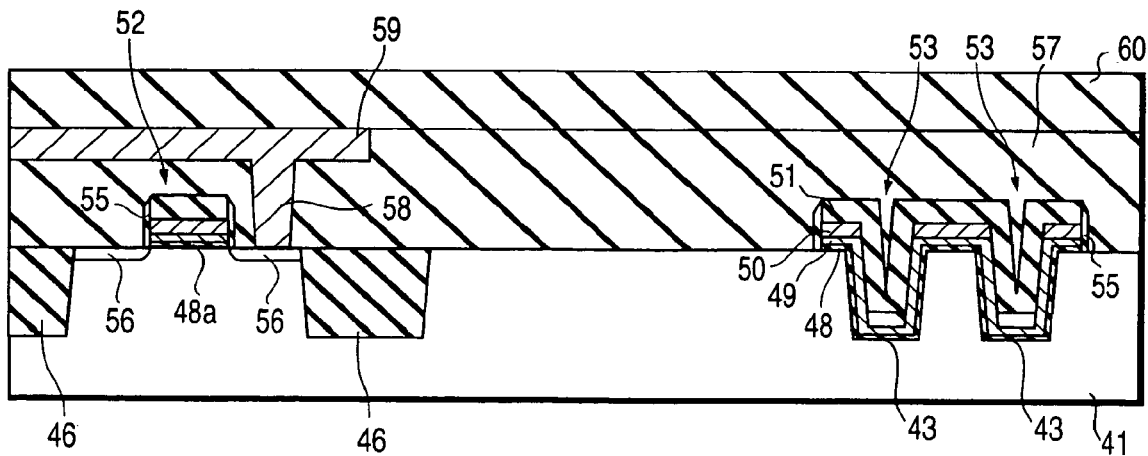
FIG. 33 is a cross sectional view showing the step following the step shown in FIG. 32 of manufacturing the conventional semiconductor device.

Further, FIG. 25A is a plan view covering the case where an acute angle portion 14d is formed in the concave portion 14 for promoting the electric field concentration. FIG. 25B is a cross sectional view along the line 25B-25B shown in FIG. 25A.

According to the fourth embodiment, the anti-fuse portion of the present invention can be formed in the minimum processing size of the element region 16a or the gate electrode 24 or in a size several times as large as the minimum processing size noted above, e.g., about $0.4\ \mu m \times 1\ \mu m$ in the generation of $0.13\ \mu m$. Therefore, the area occupied by the anti-fuse portion can be made sufficiently small, compared with the conventional anti-fuse portion, e.g., about $2\ \mu m \times 10\ \mu m$. It follows that it is possible to diminish the chip area of the semiconductor device and to decrease the manufacturing cost of the semiconductor device.

FIFTH EMBODIMENT

In general, a capacitor element is formed in many cases within the semiconductor device for stabilizing the power source. In this embodiment, used is a capacitor formed of a gate insulating film 48, as shown in FIG. 26. For further stabilizing the power source, it is necessary to form a capacitor having a larger capacitance within the semiconductor device. However, in recent years, the area occupied by the capacitor for stabilizing the power source has been rendered large relative to the area of the entire chip so as to increase the manufacturing cost of the semiconductor device. Such being the situation, it is required to diminish the area occupied by the capacitor for stabilizing the power source.

In the fifth embodiment, the construction of the semiconductor device having a plurality of concave portions 14 as shown in FIG. 16 is applied to the capacitor element.

As shown in FIG. 27A, a plurality of concave portions 14 are formed within the silicon substrate 11 as in the structure shown in FIG. 16, and each of these concave portions 14 is filled with a gate insulating film 18b' and the polysilicon film 19.

It is desirable to use, for example, a silicon oxynitride film as the gate insulating film 18b' for the capacitor element. The silicon oxynitride film can be formed by, for example, oxidizing the surface of the silicon substrate 11 at 750 □ under a nitrogen/water vapor/hydrochloric acid atmosphere, followed by oxynitriding the resultant oxide film at 900 □ under a nitrogen/nitrogen monoxide atmosphere. In the case of using the silicon oxynitride film thus formed, it has been clarified that the breakdown voltage is unlikely to be lowered in the corner portions of the concave portion 14 and in the bottom surface and the side surface of the concave portion 14. Such being the situation, it is possible to use the stepped portion (concave portion 14) of the silicon substrate 11 as a capacitor element for stabilizing the power source, not as the anti-fuse element, as described previously in conjunction with the first to fourth embodiments.

According to the fifth embodiment, the concave portion 14 of the silicon substrate 11 can be used as a capacitor element for stabilizing the power source, not as the anti-fuse element, because a silicon oxynitride film whose breakdown voltage is unlikely to be lowered is used as the gate insulating film 18b'. Also, the surface area of the gate insulating film 18b' can be increased by forming a plurality of concave portions 14 within the silicon substrate 11. It follows that the capacitance of the capacitor can be increased without increasing the area occupied by the capacitor.

For example, where concave portions 14 each having a width of 0.13 μm and a depth of 0.2 μm are repeatedly formed within the silicon substrate 11 with a space of 0.13 μm provided between the adjacent concave portions 14, it is possible to diminish the area of the capacitor element to about 1/2.5 of the area in the prior art even in the case of using the same gate insulating film. It follows that the area occupied by the capacitor can be diminished, making it possible to manufacture a semiconductor device with a low manufacturing cost.

Incidentally, it is desirable for the concave portions 14 to be shaped linear as shown in FIG. 27B, and not to be shaped to form islands as shown in FIG. 22A. Where the concave portions 14 are shaped linear, the surface area of the gate insulating film 18b' can be increased so as to increase the capacitance of the capacitor without increasing the area occupied by the capacitor.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
 a semiconductor substrate;
 a first concave portion formed in the semiconductor substrate and buried with an isolation insulating film;
 a second concave portion formed in the semiconductor substrate and having a depth from a top surface of the semiconductor substrate, the depth being equal to a depth of the first concave portion;
 a first gate insulating film formed on a side surface of the second concave portion; and
 a first gate electrode formed on the first gate insulating film;
 a third concave portion formed in the semiconductor substrate and adjacent to the second concave portion in a row direction;
 a fourth concave portion formed in the semiconductor substrate and adjacent to the second concave portion in a column direction;
 a fifth concave portion formed in the semiconductor substrate and adjacent to the fourth concave portion in the row direction;
 a second gate insulating film extending from a side surface of the fifth concave portion to a bottom surface of the fourth concave portion; and
 a second gate electrode formed on the second gate insulating film,
 wherein the first gate insulating film and the first gate electrode extend from the side surface of the second concave portion to a bottom surface of the third concave portion, and
 wherein a first contact that is connected to the first gate electrode is formed above the bottom surface of the third concave portion, and a second contact that is connected to the second gate electrode is formed above a bottom surface of the fourth concave portion.

2. The semiconductor device according to claim 1, further comprising a conductive film formed on the first gate electrode.

3. The semiconductor device according to claim 2, wherein the conductive film is a tungsten film.

4. The semiconductor device according to claim 1, wherein the semiconductor substrate is an SOI substrate having an insulating layer.

5. The device according to claim 1, further comprising:
 a third gate insulating film formed on the top surface of the semiconductor substrate; and
 a third gate electrode formed on the third gate insulating film.

6. The device according to claim 1, further comprising:
 a sixth concave portion formed in the semiconductor substrate and having a depth from the top surface of the semiconductor substrate, the depth being equal to each of the depths of the first and second concave portions;
 a third gate insulating film formed on a bottom surface of the sixth concave portion; and
 a third gate electrode formed on the third gate insulating film.

7. The device according to claim 1 wherein a contact face between the first contact and the first gate electrode is lower than an upper surface of the semiconductor substrate.

8. The device according to claim 1, wherein the first gate insulating film functions as an insulating film for one of an anti-fuse portion and a capacitor element.

9. A semiconductor device comprising:

a semiconductor substrate;
a first concave portion formed in the semiconductor substrate and buried with an isolation insulating film;
a second concave portion formed in the semiconductor substrate and having a depth from a top surface of the semiconductor substrate, the depth being equal to a depth of the first concave portion;
a first gate insulating film formed on a side surface of the second concave portion, one end portion of the first gate insulating film being in contact with a bottom surface of the second concave portion; and
a first gate electrode formed on the first gate insulating film.

10. The device according to claim 9, further comprising a conductive film formed on the first gate electrode.

11. The semiconductor device according to claim 10, wherein the conductive film is a tungsten film.

12. The semiconductor device according to claim 9, wherein the semiconductor substrate is an SOI substrate having an insulating film.

13. The device according to claim 9, further comprising:
a second gate insulating film formed on a top surface of the semiconductor substrate; and
a second gate electrode formed on the second gate insulating film.

14. The device according to claim 9, further comprising:
a third concave portion formed in the semiconductor substrate and adjacent to the second concave portion in a row direction;
a fourth concave portion formed in the semiconductor substrate and adjacent to the second concave portion in a column direction;
a fifth concave portion formed in the semiconductor substrate and adjacent to the fourth concave portion in the row direction;
a second gate insulating film extending from a side surface of the fifth concave portion to a bottom surface of the fourth concave portion; and
a second gate electrode formed on the second gate insulating film,
wherein the first gate insulating film and the first gate electrode extend from the side surface of the second concave portion to a bottom surface of the third concave portion, and
wherein a first contact that is connected to the first gate electrode is formed above the bottom surface of the third concave portion, and a second contact that is connected to the second gate electrode is formed above the bottom surface of the fourth concave portion.

15. The device according to claim 14, wherein a contact face between the first contact and the first gate electrode is lower than an upper surface of the semiconductor substrate.

16. The device according to claim 9, wherein the first gate insulating film functions as an insulating film for one of an anti-fuse portion and a capacitor element.

* * * * *